United States Patent
Guilford et al.

(10) Patent No.: US 10,055,135 B2
(45) Date of Patent: Aug. 21, 2018

(54) METHOD AND APPARATUS FOR COMPRESSING A DATA SET USING INCREMENTAL DELTAS AND A VARIABLE REFERENCE VALUE

(71) Applicant: Intel Corporation, Santa Clara, CA (US)

(72) Inventors: James D. Guilford, Northborough, MA (US); Vinodh Gopal, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/240,144

(22) Filed: Aug. 18, 2016

(65) Prior Publication Data
US 2018/0052611 A1 Feb. 22, 2018

(51) Int. Cl.
*H03M 7/30* (2006.01)
*G06F 3/06* (2006.01)

(52) U.S. Cl.
CPC .......... *G06F 3/0608* (2013.01); *G06F 3/0646* (2013.01); *G06F 3/0673* (2013.01)

(58) Field of Classification Search
CPC .... G06F 3/0608; G06F 3/0673; G06F 3/0646; H03M 5/00; H03M 7/00
USPC ......................................... 341/51, 67, 50, 76
See application file for complete search history.

(56) References Cited

U.S. PATENT DOCUMENTS

| | | | | |
|---|---|---|---|---|
| 8,271,426 B2* | 9/2012 | Ramaiyer | ......... | G06F 17/30356 707/600 |
| 8,548,962 B2* | 10/2013 | Tapply | .................... | H03M 7/30 704/501 |
| 8,912,932 B2* | 12/2014 | Chen | ................... | H03M 7/3086 341/51 |
| 9,007,241 B2* | 4/2015 | Alhussien | ........... | H03M 13/618 341/67 |
| 2005/0022175 A1 | 1/2005 | Sliger et al. | | |
| 2011/0316728 A1 | 12/2011 | Xiao | | |
| 2012/0185612 A1 | 7/2012 | Zhang et al. | | |
| 2015/0066884 A1* | 3/2015 | Tomarkin | .......... | G06F 17/30289 707/695 |
| 2015/0181236 A1 | 6/2015 | Hsieh et al. | | |
| 2016/0226513 A1 | 8/2016 | Liaghati | | |

OTHER PUBLICATIONS

International Search Report and Written Opinion of the ISA issued in PCT/US2017/042500 dated Oct. 16, 2017 (9 pages).

* cited by examiner

*Primary Examiner* — Jean B Jeanglaude
(74) *Attorney, Agent, or Firm* — Alliance IP, LLC (57) ABSTRACT

An apparatus comprises a processor to receive a plurality of values of a data set, the data set comprising a first value, a second value, and a third value; calculate and store a first delta corresponding to the first value, wherein the first delta is equal to the difference between the first value and the second value; and calculate and store a second delta corresponding to the second value, wherein the second delta is equal to the difference between the second value and the third value.

20 Claims, 7 Drawing Sheets

| UNUSED | $d_0$ | $d_1$ | $d_2$ | . | . | . | $d_{n-1}$ | REFERENCE VALUE ($A_n$) |

| UNUSED | $d_1$ | $d_3$ | $d_5$ | . | . | . | $d_{n-3}$ | REFERENCE VALUE ($A_{n-1}$) | UNUSED | $d_0$ | $d_2$ | $d_4$ | . | . | . | $d_{n-2}$ | REFERENCE VALUE ($A_n$) |

| UNUSED | $d_3$ | $d_7$ | . | . | $d_{n-7}$ | REFERENCE VALUE ($A_{n-3}$) | UNUSED | $d_2$ | $d_6$ | . | . | $d_{n-6}$ | REFERENCE VALUE ($A_{n-2}$) | UNUSED | $d_1$ | $d_5$ | . | . | $d_{n-5}$ | REFERENCE VALUE ($A_{n-1}$) | UNUSED | $d_0$ | $d_4$ | . | . | $d_{n-4}$ | REFERENCE VALUE ($A_n$) |

| | | | | |
|---|---|---|---|---|
| 1000 | | | | UNUSED |
| 1001 | 1 | | | UNUSED |
| 1003 | 2 | 1 | | UNUSED |
| 1006 | 3 | 2 | 1 | UNUSED |

| | | | |
|---|---|---|---|
| 1003 | 2 | 1 | UNUSED |
| 1001 | 1 | | UNUSED |
| 1000 | | | UNUSED |
| | | | UNUSED |

| VALUE PUSHED |
|---|
| 1000 |
| 1001 |
| 1003 |
| 1006 |

| VALUE POPPED |
|---|
| 1006 |
| 1003 |
| 1001 |
| 1000 |

METHOD AND APPARATUS FOR COMPRESSING A DATA SET USING INCREMENTAL DELTAS AND A VARIABLE REFERENCE VALUE

FIELD

The present disclosure relates in general to the field of computer development, and more specifically, to data compression.

BACKGROUND

A computing device may include one or more processors, one or more memory devices, and one or more communication controllers, among other components. Logic of the computing device may be operable to access and compress a data set.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
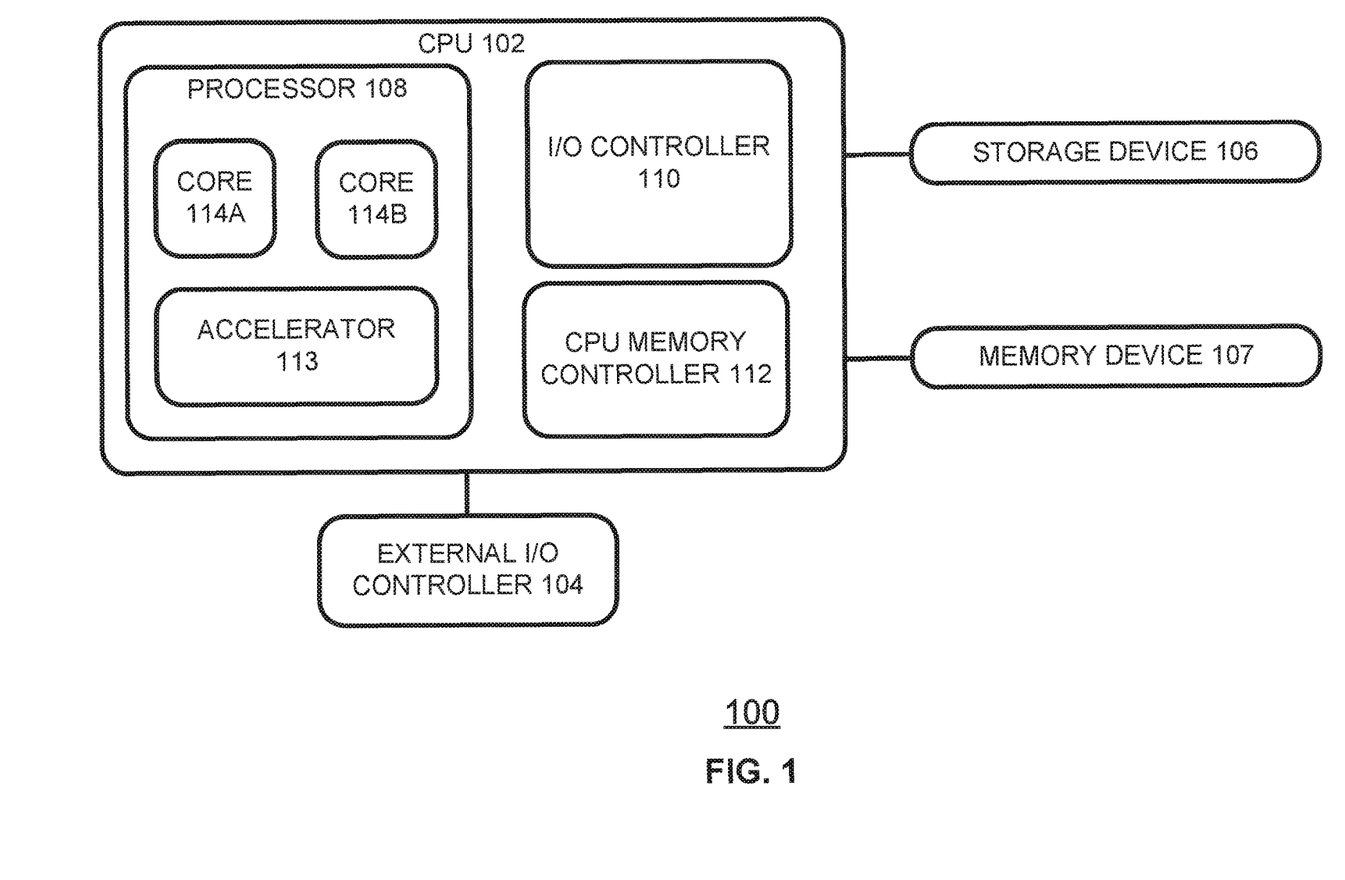
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a storage device 106, and a memory device 107. During operation, data may be transferred between storage device 106, memory device 107, or other I/O device and the CPU 102. In various embodiments, particular data operations involving a storage device 106, memory device 107, I/O controller 110, CPU memory controller 112, or the external I/O controller 104 may be managed by an operating system or other software application executed by processor 108.

During operation, any suitable component of system 100 may store a data set. A data set may comprise a plurality of values that may each be expressed using a sequence of bits. For example, a data set may comprise a list of addresses, indexes, pointers, offsets, hash values, alphanumeric codes, other numbers, and/or other values. In various systems, a data set may be stored in an uncompressed manner. For example, a data set may be stored as a collection of 32 bit values or 64 bit values. However, such a method of storage may be expensive in terms of memory usage and bandwidth. In some systems, a data set may be compressed using a "base-delta" encoding, where the first number ("base") is stored in its original form (e.g. a 64-bit number), and the subsequent values are represented by their difference form the first number (i.e., their deltas). These deltas are generally more compact than the corresponding values of the data set, thus resulting in the use of less storage space.

In various embodiments of the present disclosure, system 100 may compress a data set using a variable reference value that is updated as values are added to the compressed data set. In various embodiments, when a value from the data set is to be added to the compressed data set, a delta between the reference value and the value to be added to the compressed data set is calculated and the delta is added to the compressed data set. The reference value is then changed to the value to be added to the compressed data set. In this manner, each value of the original data set corresponds to a delta in the compressed data set except the last value of the original data set which is stored as the reference value in the compressed data set. Since each delta is computed as the difference of two consecutive values of the data set (as opposed to each delta being computed as the difference between a fixed base number), the deltas are incremental and thus may be represented using less space (e.g., bits) when used to compress particular data sets. For example, data sets that comprise monotonic or other sequences in which successive values do not have a large delta with respect to each other but later values have progressively large offsets to the first value may particularly benefit from compression according to various embodiments described herein.

In particular embodiments, the values of a data set are compressed among multiple blocks in a round robin fashion, where each block includes a variable reference value and deltas based on the particular reference value. Such embodiments may provide parallelism providing faster access to values of the compressed data set.

Various embodiments may be applied to compress any suitable types of data sets that may be used, for example, in various applications such as string-matching/indexing algorithms, web-page indexing/search, compression algorithms maintaining a list of potentially matching string positions, compact representations of sparse matrices by indices of non-zero elements, the compression of Hypertext Transfer Protocol (HTTP) traffic, or other suitable applications.

Various embodiments of the present disclosure may provide technical advantages, such as reducing the amount of storage used to store a compressed data set, reducing the bandwidth used to transfer compressed data, and other technical advantages.

CPU 102 comprises a processor 108, such as a microprocessor, an embedded processor, a digital signal processor (DSP), a network processor, a handheld processor, an application processor, a co-processor, a system on a chip (SOC), other device to execute code (i.e., software instructions), or other fixed or configurable logic that perform logical operations. Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; an FPGA, a wireless transceiver; a network processor; a network interface controller; or a controller for another input device such as a monitor, printer, mouse, keyboard, or scanner; or other suitable device. In a particular embodiment, an I/O device may comprise a storage device 106 coupled to the CPU 102 through I/O controller 110. In some embodiments, I/O controller 110 may be implemented on the same chip as CPU 102, whereas in other embodiments, I/O controller 110 may be implemented on a different chip than that of CPU 102.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more memory devices 107. CPU memory controller 112 may include logic operable to read from a memory device 107, write to a memory device 107, or to request other operations from a memory device 107. In various embodiments, CPU memory controller 112 may receive write requests from cores 114 and/or I/O controller 110 and may provide data specified in these requests to a memory device 107 for storage therein. CPU memory controller 112 may also read data from a memory device 107 and provide the read data to I/O controller 110 or a core 114. During operation, CPU memory controller 112 may issue commands including one or more addresses of the memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A memory device 107 may store any suitable data, such as data used by processors 106 to provide the functionality of computer system 100. For example, data associated with programs that are executed or files accessed by cores 114 may be stored in memory device 107. Thus, a memory device 107 may include a system memory that stores data and/or sequences of instructions that are used or executed by the cores 114. In various embodiments, a memory device 107 may store persistent data (e.g., a user's files or instruction sequences) that remains stored even after power to the memory device 107 is removed. A memory device 107 may be dedicated to a particular CPU 102 or processor 108 or shared with other devices (e.g., one or more other CPUs, processors, or other devices) of computer system 100.

In various embodiments, a memory device 107 may include a memory comprising any number of memory modules, a memory device controller, and other supporting logic (not shown). A memory module may include a plurality of memory cells that are each operable to store one or more bits. The cells of a memory module may be arranged in any suitable fashion, such as in rows (e.g., wordlines) and columns (e.g., bitlines), three dimensional structures, or other manners. In various embodiments, the cells may be logically grouped into banks, blocks, subblocks, wordlines, pages, frames, bytes, or other suitable groups. A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistorless stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114 may be stored in storage device 106. Thus, in some embodiments, a storage device 106 may store data and/or sequences of instructions that are used or executed by the cores 114. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100. In various embodiments, storage device 106 may include a storage device controller and a memory comprising one or more memory modules.

Accelerator 113 may comprise any suitable logic to perform specialized processing tasks on behalf of one or more CPUs. Any specialized processing tasks may be performed by accelerator 113, such as graphics processing, cryptography operations, mathematical operations, TCP/IP processing, or other suitable functions. In particular embodiments, accelerator 113 may comprise reconfigurable logic gates. For example, accelerator 113 may be an field-programmable gate array (FPGA). In various embodiments, the accelerator 113 may be located on the same chip as a CPU 102 or processor 108 or on a different chip. In particular embodiments, accelerator 113 may be coupled to one or more CPUs 102 via a dedicated interconnect.

Although not depicted, system 100 may use a battery, renewable energy converter (e.g., solar power or motion-based energy), and/or power supply outlet connector and associated system to receive power, a display to output data provided by one or more processors 106, or a network interface allowing the processor 108 to communicate over a network. In various embodiments, the battery, power supply outlet connector, display, and/or network interface may be communicatively coupled to processor 108.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, a Gunning transceiver logic (GTL) bus, or other type of interconnect.

Figure 2:
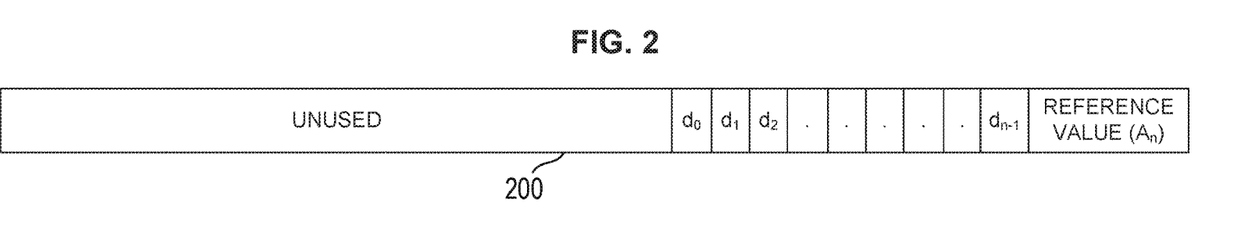
FIG. 2 illustrates a compressed data set using a single reference value in accordance with certain embodiments.

FIG. 2 illustrates a compressed data set using a single reference value in accordance with certain embodiments. The compressed data set is stored in a memory 200. In various embodiments, the memory 200 may be located within any component of system 100, such as a core 114, an accelerator 113, a storage device 106, a memory device 107, other component of system 100, or any other suitable computing component.

The compressed data set comprises a reference value $A_n$ and a plurality of deltas $d_0$ through $d_{n-1}$. In the various examples used herein, the subscript of a reference value or a delta value is used to refer to the position of a corresponding value of the data set that is being compressed. For example, $d_0$ is the delta that corresponds to the first value of a data set, $d_1$ is the delta that corresponds to the second value of a data set, $d_{n-1}$ is the delta that corresponds to $n^{th}$ value of the data set, and $A_n$ corresponds to the $n+1^{th}$ value of the data set. Similar notation is used in FIGS. 3 and 4. The reference value $A_n$ is a variable reference value that may change when one or more new values are added to the compressed data set.

The first value of an uncompressed data set to be compressed in memory 200 may initially be stored as the reference value. When the second value of the uncompressed data set is pushed into the compressed set, a delta between the second value and the reference value is determined (e.g., the reference value may be subtracted from the second value) and this delta is stored in block 200 and the reference value is overwritten with the second value. Accordingly, at this stage, the second value of the uncompressed data set could be reconstituted as the reference value and the first value of the uncompressed data set could be reconstituted by subtracting the stored delta from the reference value. When the third value of the uncompressed data set is pushed into the compressed set, a second delta between the third value and the reference value (which is now the second value from the uncompressed data set) is determined and this second delta is also stored in memory 200 and the reference value is overwritten with the third value. In various embodiments, the first delta may be shifted within memory 200 by the number of bits used to store the second delta to make room for storage of the second delta. Accordingly, at this stage, the third value of the uncompressed data set could be reconstituted as the reference value, the second value of the uncompressed data set could be reconstituted by subtracting the second delta from the reference value, and the first value of the uncompressed data set could be reconstituted by subtracting the second delta from the reference value and then subtracting the first delta (which is equivalent to subtracting the first delta from the second value of the uncompressed data set). When subsequent values of the uncompressed data set are pushed to the compressed set, a corresponding delta between the value to be pushed and the current reference value is computed, the delta is stored in memory 200, and the reference value is updated to the value being pushed.

Thus, referring to the compressed data set represented in FIG. 2, a value $V_i$ of the uncompressed data set (where i represents the position of the value within the uncompressed data set, n represents one less than the number of values that have been pushed to the uncompressed data set, and $0 \leq i < n$) may be calculated according to the following equation (note that when i is equal to n $V_i = A_n$):

$$V_i = A_n - \sum_{j=i}^{n-1} d_j$$

Thus, the values of the uncompressed data set corresponding to the compressed data set shown in memory 200 are:

$V_0 = A_n - d_{n-1} - \ldots - d_2 - d_1 - d_0$
$V_1 = A_n - d_{n-1} - \ldots - d_2 - d_1$
$V_2 = A_n - d_{n-1} - \ldots - d_2$
$\ldots$
$V_{n-1} = A_n - d_{n-1}$
$V_n = A_n$ To remove (e.g., "pop") a value from the compressed data set, the reference value is accessed (this is the value that is to be removed from the compressed set) and a new reference value is computed as the reference value minus the most recently added delta. The new reference value is stored as the reference value and the most recently added delta is deleted. Deletion of the delta may comprise any suitable operations that remove the delta from being considered as part of the compressed data set. For example, deletion of the delta may comprise one or more of physically erasing memory cells storing the delta, rewriting memory cells where the delta was stored with different data, marking the memory cells storing the delta as storing invalid data, or other suitable operations.

In various embodiments, each delta being added to memory 200 in response to a push operation may be placed in the first position of a list of deltas and each existing delta then occupies a position one later than the position previously held by the deltas, such that the deltas are arranged in memory 200 based on the order in which they were added to the memory. In particular embodiments, this may be accomplished by shifting all of the existing deltas by the number of bits used to store the new delta prior to storing the new delta. In other embodiments, a pointer representing the position of the first delta may be updated. In some embodiments, the new delta may be stored between the other deltas and the reference value (e.g., in embodiments where the reference value is stored in the same memory block as the deltas). Similarly, when a delta is deleted, the next most recently added delta occupies the first position of a list of deltas and the position of each other existing delta moves forward by one. For example, the deltas other than the one being deleted may be shifted in memory 200 by the size (e.g., number of bits) of the deleted delta, such that the next most recently added delta now occupies one or more memory cells that previously stored the most recently added delta that is now deleted (e.g., the first bit of the delta may occupy the position previously held by the first bit of the deleted delta).

Figure 5:
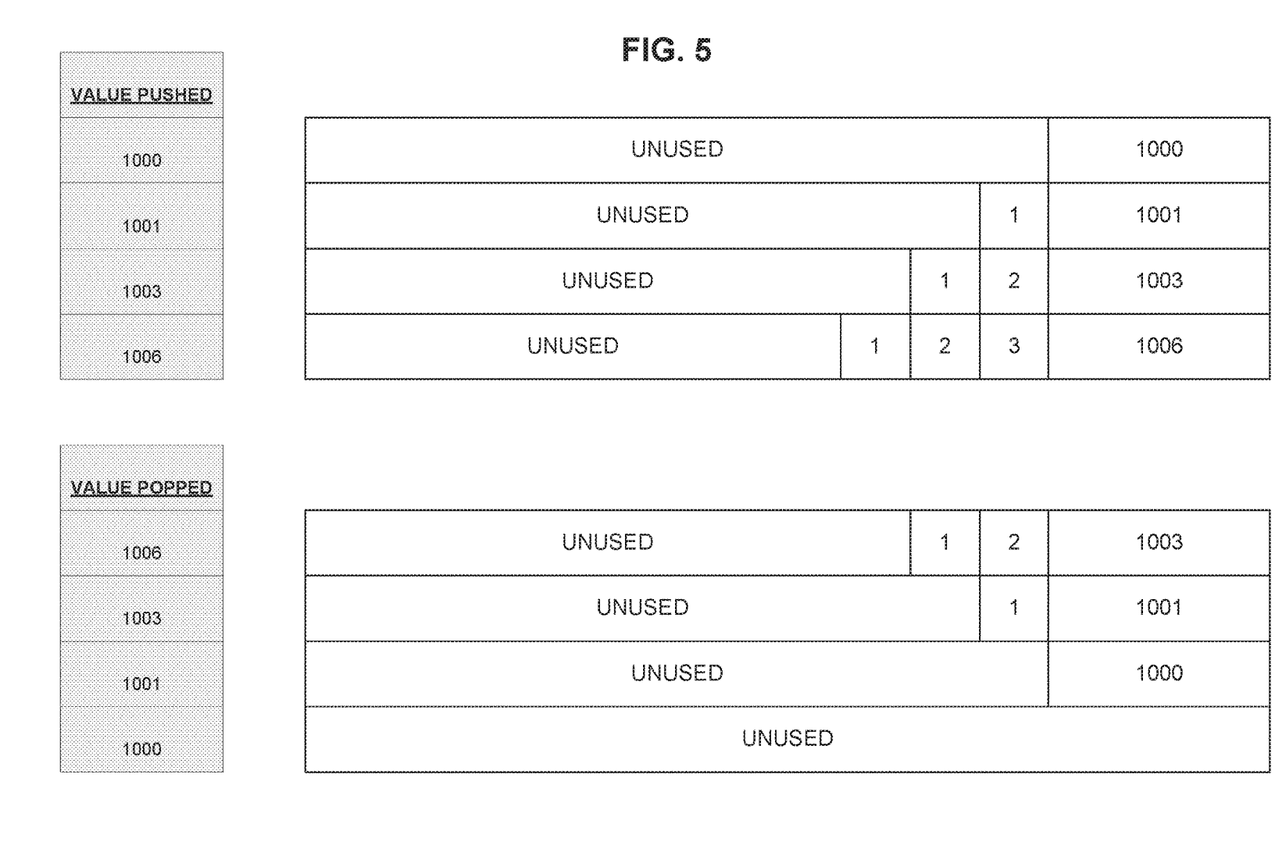
FIG. 5 illustrates example states of a compressed data set in accordance with certain embodiments.

FIG. 5 illustrates example states of a compressed data set in accordance with certain embodiments. In the example depicted, an uncompressed data set comprises a monotonic increasing sequence of four values: 1000, 1001, 1003, and 1006. When the first value is pushed (pushing a value may include storing a representation of a value in the memory that is to hold the compressed data set) to the memory, the first value may be stored as a reference value in a location of the memory reserved for the reference value. Accordingly, after 1000 is pushed, the reference value is 1000 and the remaining space of the memory is unused. In various embodiments, the reference value may be in an uncompressed format that matches the format of the value from the uncompressed data set. For example, the reference value may be stored as a 32 bit or 64 bit integer. In other embodiments, the reference value may be in any other suitable format, such as a compressed format as long as the corresponding uncompressed value is recoverable.

When 1001 is pushed, the delta between 1001 and the current reference value (1000) is calculated and the calculated delta is added to the memory block. The reference value is also overwritten with the pushed value. Accordingly, the reference value after 1001 is pushed is 1001 and a delta of 1 has been added to the memory.

When 1003 is pushed, the delta between 1003 and the current reference value (1001) is calculated and the calculated delta is added to the memory. The reference value is also overwritten with the value pushed. Accordingly, the reference value after 1003 is pushed is 1003 and the memory block now also includes a delta of 2. In the embodiment depicted, prior to the new delta (2) being added to the memory block, the existing delta (1) is shifted to the left to make room for the new delta.

When 1006 is pushed, the delta between 1006 and the current reference value (1003) is calculated and the calculated delta is added to the memory block. The reference value is also overwritten with the value pushed. Accordingly, the reference value after 1006 is pushed is 1006 and the memory block now also includes a delta of 3. In the embodiment depicted, prior to the new delta (3) being added to the memory block, the existing deltas (1 and 2) are shifted to the left to make room for the new delta.

The next portion of FIG. 5 shows the values being popped from the memory block. In each case the reference value is popped, the next reference value is calculated by subtracting the most recently added delta from the popped reference value, and the most recently added delta is deleted. The other deltas may be shifted over (such that at least a portion of the next most recent delta now occupies memory that previously stored the most recently added delta). As depicted, when 1006 is popped, the new reference value is 1003 (1006−3), the delta having the value of 3 is deleted, and the remaining deltas are shifted over. After 1003 is popped, the new reference value is 1001 (1003−2), the delta having the value of 2 is deleted, and the remaining delta is shifted over. After 1001 is popped, the new reference value is 1000 (1001−1) and there are no remaining deltas. After 1000 is popped, the memory is empty.

Although various embodiments describe or depict values being pushed or popped one at a time (with the reference value being updated each time a value is pushed or popped), in particular embodiments any suitable number of values may be pushed or popped at a time (with the reference value being updated once during the multiple pushes or pops).

As one example, the four values depicted in FIG. 5 could be pushed by determining the first delta as the difference between the first and second values of the uncompressed data set, the second delta as the difference between the second and third values of the uncompressed data set, and the third delta as the difference between the third and fourth values of the uncompressed data set. These deltas could be stored to memory simultaneously (or one after the other) and the fourth value (1006) could be saved as the reference value. Accordingly, the reference value would not be updated after each value is pushed. The next four values of the uncompressed data set could then be pushed together in a similar manner. Any suitable number of deltas may be calculated and stored in the memory each time the reference value is overwritten.

As another example, multiple values may be popped with only a single rewriting of the reference value. Any suitable number of values associated with a particular reference value may be popped at a time. For example, if four values were to be popped, the reference value and the three most recently added deltas may be accessed and used to calculate the last four values pushed to the memory. A new reference value may then be calculated as the old reference value minus the four most recently added deltas. The new reference value would be written over the old reference value and the four most recently added deltas deleted. Such an embodiment could involve an implicit updating of the reference value without storing the updated reference value until all of the values to be popped have been determined. For example, the reference value minus the most recently added delta may result in a new implicit reference value (which is also the second value being popped), the new implicit reference value minus the second most recently added delta may result in yet another new implicit reference value, and so on, while the last implicit reference value calculated during the sequence is then stored as the new reference value.

Figure 3:
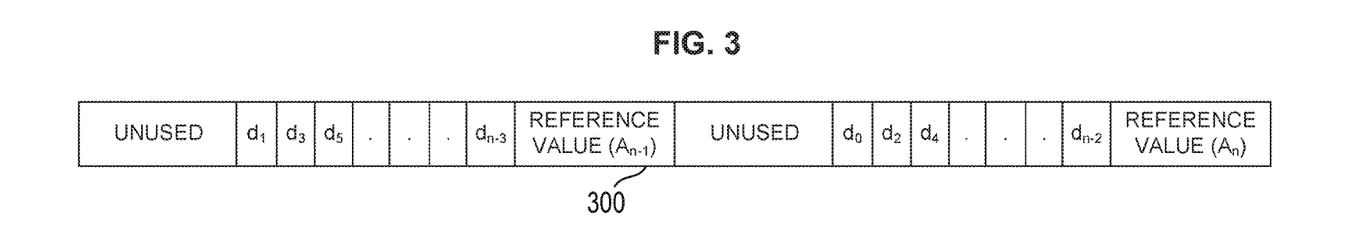
FIG. 3 illustrates a compressed data set using two reference values in accordance with certain embodiments.

FIG. 3 illustrates a compressed data set using two reference values in accordance with certain embodiments. Using two reference values provides a parallelism that allows values to be retrieved from the compressed data set at a faster rate.

A memory may be split into multiple regions that each are to store a reference value. In the embodiment depicted, a first region stores reference value $A_n$ and delta values $d_0, d_2, d_4, \ldots$, and $d_{n-2}$ associated with reference value $A_n$; and a second region stores reference value $A_{n-1}$ and delta values $d_1, d_3, d_5, \ldots$, and $d_{n-3}$ associated with reference value $A_{n-1}$.

The first value of an uncompressed data set to be compressed in memory 300 may initially be stored as the first reference value. The second value of the uncompressed data set may initially be stored in memory 300 as the second reference value. When the third value of the uncompressed data set is pushed to memory 300, a delta between the third value and the first reference value is determined (e.g., the first reference value may be subtracted from the third value). This delta is stored in memory 300 (e.g., adjacent to the first reference value or at another suitable memory location) and the first reference value is overwritten with the third value. When the fourth value of the uncompressed data set is pushed to memory 300, a delta between the fourth value and the second reference value is determined (e.g., the second reference value may be subtracted from the fourth value). This delta is stored in memory 300 (e.g., adjacent to the second reference value or at another suitable memory location) and the second reference value is overwritten with the fourth value.

When the fifth value of the uncompressed data set is pushed to memory 300, a delta between the fifth value and the first reference value is determined (e.g., the first reference value may be subtracted from the fifth value). This delta is stored in memory 300 (e.g., adjacent to the first reference value or at another suitable memory location) and the first reference value is overwritten with the fifth value. Prior to storing the delta in memory 300, the delta that was determined when the third value of the uncompressed data set was pushed may be shifted to make room for the new delta. When the sixth value of the uncompressed data set is pushed to memory 300, a delta between the sixth value and the second reference value is determined (e.g., the second reference value may be subtracted from the sixth value). This delta is stored in memory 300 (e.g., adjacent to the second reference value or at another suitable memory location) and the second reference value is overwritten with the sixth value. Prior to storing the delta in memory 300, the delta that was determined when the fourth value of the uncompressed data set was pushed may be shifted to make room for the new delta.

At this stage, the sixth value of the uncompressed data set could be reconstituted as the second reference value, the fifth value of the uncompressed data set could be reconstituted as the first reference value, the fourth value of the uncompressed data set could be reconstituted as the second reference value minus the most recently added delta in the second region (i.e., the region associated with the second reference value), the third value of the uncompressed data set could be reconstituted as the first reference value minus the most recently added delta in the first region (i.e., the region associated with the first reference value), the second value of the uncompressed data set could be reconstituted as the second reference value minus both of the deltas in the second region, and the first value of the uncompressed data set could be reconstituted as the first reference value minus both of the deltas in the first region.

Additional values may be pushed from an uncompressed set in a similar manner by continuing to alternate between the regions in which the corresponding deltas are stored (which in various embodiments may involve shifting the existing deltas in the region, adding the new delta to the region, and updating the reference value of the region).

In various embodiments, an indicator (e.g., a flip flop or other logic) may be used to store an indication of the region in which the next delta corresponding to a value from the uncompressed data set is to be pushed. After a value is pushed (or multiple values pushed together), the indicator may change values so that when the next value (or values) is pushed, the corresponding delta will be pushed to the next region. Similarly, when a value is popped (or multiple values popped together) from a region, the indicator may be updated so that the next value (or values) popped comes from the other region.

In particular embodiments, the values from the uncompressed data set are all pushed into the same region, but after each value is pushed (or a set of values is pushed), the data (i.e., deltas and reference value) stored in each region is copied to the other region (i.e., the data in each region is swapped with the data in the other region). Accordingly, a value is pushed to a first region (e.g., the region on the right of FIG. 3) and then the reference value and deltas stored in the first region are copied to the second region, and the reference value and deltas stored in the second region are copied to the first region. The next value is also pushed to the first region, but this time the other reference value is in the first region and the delta is calculated with respect to this reference value. After this value is pushed to the first region, the data in each region is swapped again. This pattern may continue as the remaining values are pushed to the memory 300. In various embodiments, a similar procedure may be performed when a value is popped (or a set of values is popped). That is, a value may be popped from a first region, the data in the regions swapped, the next value popped from the first region, the data in the regions swapped, and so on. Various embodiments in which one or more regions are swapped with each other may omit the use of an indicator to track the region that should be written to or popped from.

Figure 4:
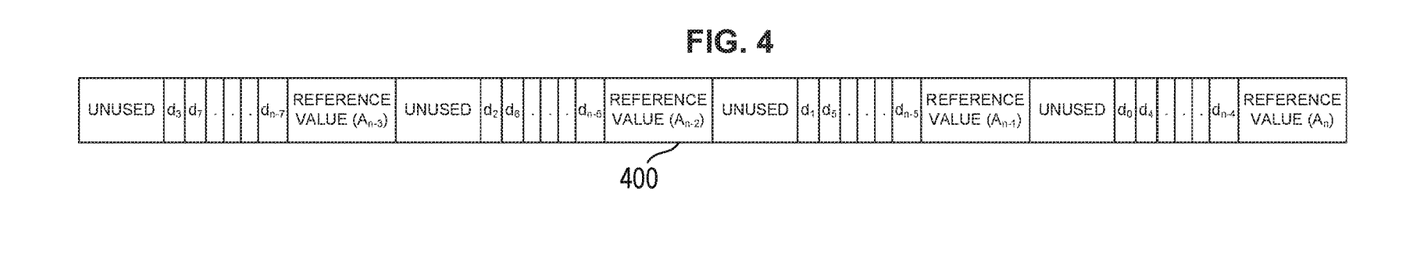
FIG. 4 illustrates a compressed data set using four reference values in accordance with certain embodiments.

FIG. 4 illustrates a compressed data set using four reference values in accordance with certain embodiments. In the embodiment depicted, memory block 400 is split into four regions that each are to store a reference value. In the embodiment depicted, a first region stores reference value $A_n$ and associated delta values, a second region stores reference value $A_{n-1}$ and associated delta values, a third region stores reference value $A_{n-2}$ and associated delta values, and a fourth region stores reference value $A_{n-3}$ and associated delta values.

The first value of an uncompressed data set to be compressed in block 400 may initially be stored as the first reference value, the second value of the uncompressed data set may initially be stored as the second reference value, the third value of the uncompressed data set may initially be stored as the third reference value, and the fourth value of the uncompressed data set may initially be stored as the fourth reference value. The values that are pushed to block 400 may be rotated among each region in a manner similar to that described above with respect to FIG. 3. For example, an indicator may be stored denoting which region the current value should be pushed to. As another example, the values may all be pushed to the same region, and after each value is pushed, the data of each region may be copied to another region. For example, if the values are all pushed to the first region, after a value is pushed the data of the second region may be copied to the first region, the data of the third region may be copied to the second region, the data of the fourth region may be copied to the third region, and the data of the first region may be copied to the fourth region. In other embodiments, the values may be pushed among the regions in any suitable order or manner.

In some embodiments, the values may be distributed unequally among multiple regions. For example, if a particular region fills up faster than another region (e.g., because the deltas in that region take up more space than the deltas in another region), additional values may be pushed to the region with remaining space (thus more deltas may be associated with a particular reference value than the number of deltas associated with another reference value). In such embodiments, system 100 may include logic specifying the order in which values should be popped.

In various embodiments, values from multiple regions may be popped in parallel, since the values reconstructed from the data in a region are not dependent on the reference values or deltas stored in other regions. Thus a value (or multiple values) may be popped from a first region in parallel with a value (or multiple values) being popped from a second region (and/or third region, fourth region, etc.) thus allowing quicker reconstruction of the uncompressed data set. In various embodiments, a set of logic that is used to reconstruct the values of the uncompressed data set that have been encoded in a first region is identical to a set of logic used to reconstruct the values of the uncompressed data set that have been encoded in a second region. Similarly, other regions may each comprise identical sets of logic.

Although various different schemes with varying numbers of regions and reference values have been depicted, various embodiments may use any suitable number of regions and reference values. Such embodiments may have any of the characteristics described above with respect to FIGS. 2-4. In various embodiments, any of the operations described above with respect to FIG. 2 or FIG. 5 may be used on each region of a memory that has multiple regions each storing their own reference value.

The deltas may be represented in any suitable format. For example, the deltas may be signed or unsigned. In various embodiments, the deltas may each be a fixed length (e.g., 10 bits, 12 bits, or other size) that is smaller than the length of the reference values. In other embodiments, the deltas may be of a variable length based on the size of the value represented by the delta. In one embodiment, each delta may be encoded with an indication of the length of the respective delta. As one example, two or more lengths for deltas may be possible. For example, in one embodiment, a delta may be 8 bits or 16 bits. As another example, in one embodiment, a delta may be 8 bits, 16 bits, 24 bits, or 32 bits. In other examples, the deltas could be any combination of suitable lengths. In various embodiments, each delta may be stored with an indication of how long the delta is. For example, if only two delta lengths are used, a delta may be stored with a header bit that specifies the length of the delta (e.g., the bit may be high for the longer length or low for the shorter length). As another example, if more than two delta lengths are used, a header having multiple bits may be used to specify the length of the delta. When a value from an uncompressed set is pushed, a corresponding delta is determined, and then a delta length for that delta is determined. A header with data specifying the delta length is then stored along with the delta at the appropriate spot. Accordingly, embodiments described herein where the preexisting deltas are shifted by the length (e.g., number of bits) of the new delta may encompass shifting the preexisting deltas (along with associated data specifying the length of each delta) by the combined length of the new delta and the header. In various embodiments, when a delta is deleted during a pop operation, the first bit of the header of the next most recently added delta is shifted into the position previously occupied by the first bit of the header of the delta that is deleted.

In various embodiments, system 100 may include logic to detect an overflow condition (when pushing) or an underflow condition (when popping). An overflow condition may indicate that sufficient space is not available for an additional value to be pushed. An underflow condition may indicate that an additional value is not available to be popped. An overflow condition and/or underflow condition may be detected on a per memory basis and/or a per region basis (when multiple reference values are used). In various embodiments, overflow logic may track the amount of space taken up by the deltas and/or the number of deltas stored and may detect an overflow condition or an underflow condition when a threshold is crossed. In some embodiments where no consecutive values are the same (and thus there will be no deltas having a value of 0), the memory space used or number of deltas stored is not tracked, but the bits of the memory block (or region) are initialized to 0 and an overflow condition may be detected when a bit value of 1 is shifted out of the memory block (or region) (e.g., when the bits are shifted to make room for a new delta). Similarly, when no consecutive values are the same, if the first delta (i.e., the one most recently added) is 0, then there are no more remaining deltas and the reference value is the last valid value that may be popped.

Figure 6:
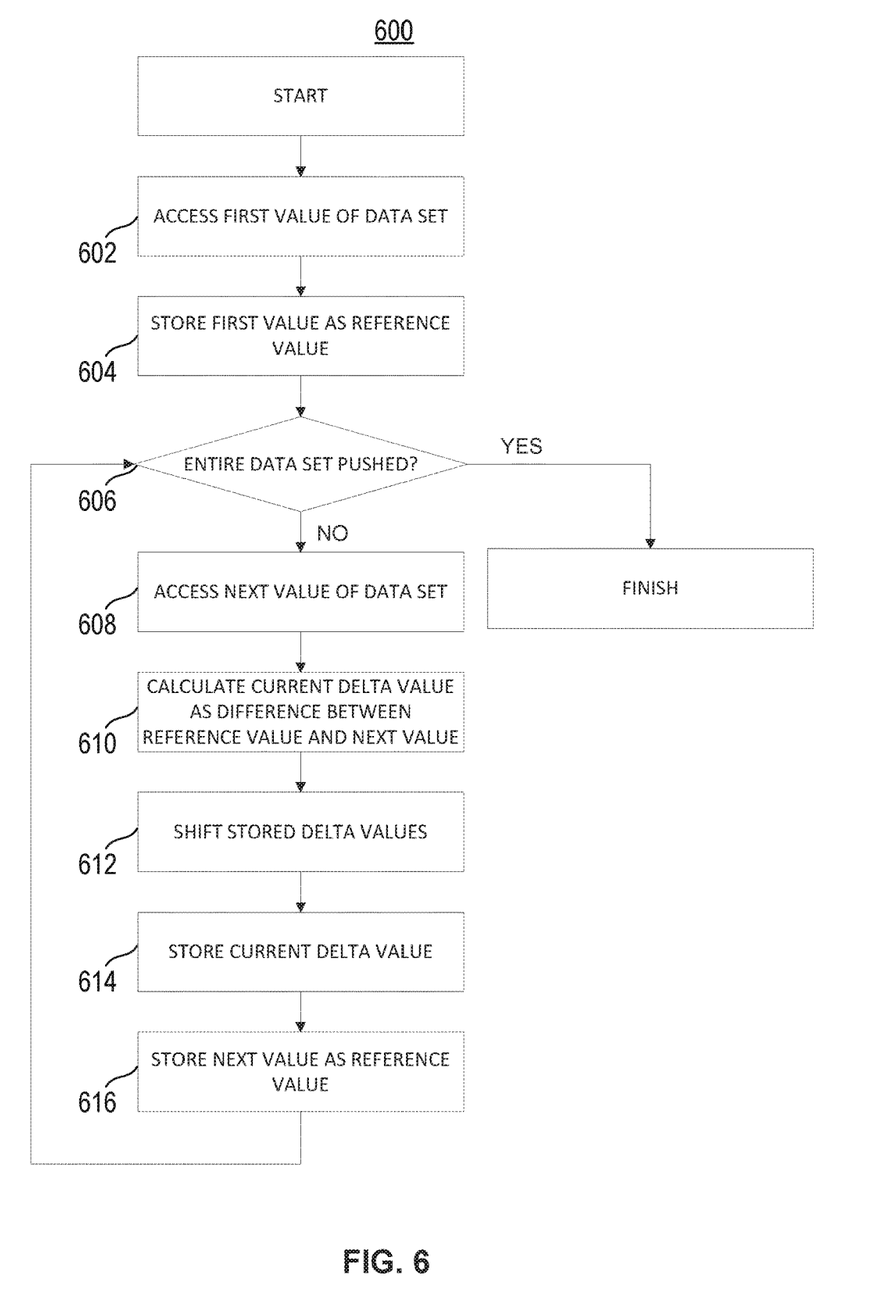
FIG. 6 illustrates an example flow for compressing a data set in accordance with certain embodiments.

FIG. 6 illustrates an example flow 600 for compressing a data set in accordance with certain embodiments. The operations, along with any other operations described herein relating to compression of a data set, may be performed by any suitable logic, such as core 114, accelerator 113, storage device 106, memory device 107, compression logic 800 (of FIG. 8), other logic of system 100, or other suitable logic. The operations may be performed by hardware and/or via software instructions executed by a processor. The operations may be performed in a per-memory manner or a per-region manner (if multiple reference values are used).

At 602, a first value of a data set is accessed. At 604, the first value is stored as a reference value. At 606, it is determined whether the entire data set has been pushed to memory (e.g., whether representations of each value of the data set have been stored in memory). If it is determined that the entire data set has been pushed, the flow is finished. If it is determined that one or more values remain to be pushed, the next value of the data set is accessed at 608.

At 610, a current delta value is calculated as the difference between the reference value and the next value. At 612, delta values that have already been stored (this step may be omitted when no delta values have been stored yet) are shifted. This may involve determining the number of bits that will be used to store the current delta value (and header if used) and setting the number of bits by which to shift the deltas accordingly. At 614, the current delta value is stored (e.g., in a position opened up by the shifting performed at 612). At 616, the next value is stored as the reference value. The flow then returns to 606 and repeats until the entire data set has been pushed to memory.

The flow described in FIG. 6 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 6 may be repeated, combined, modified or omitted where appropriate. Additionally, operations may be performed in any suitable order without departing from the scope of particular embodiments.

Figure 7:
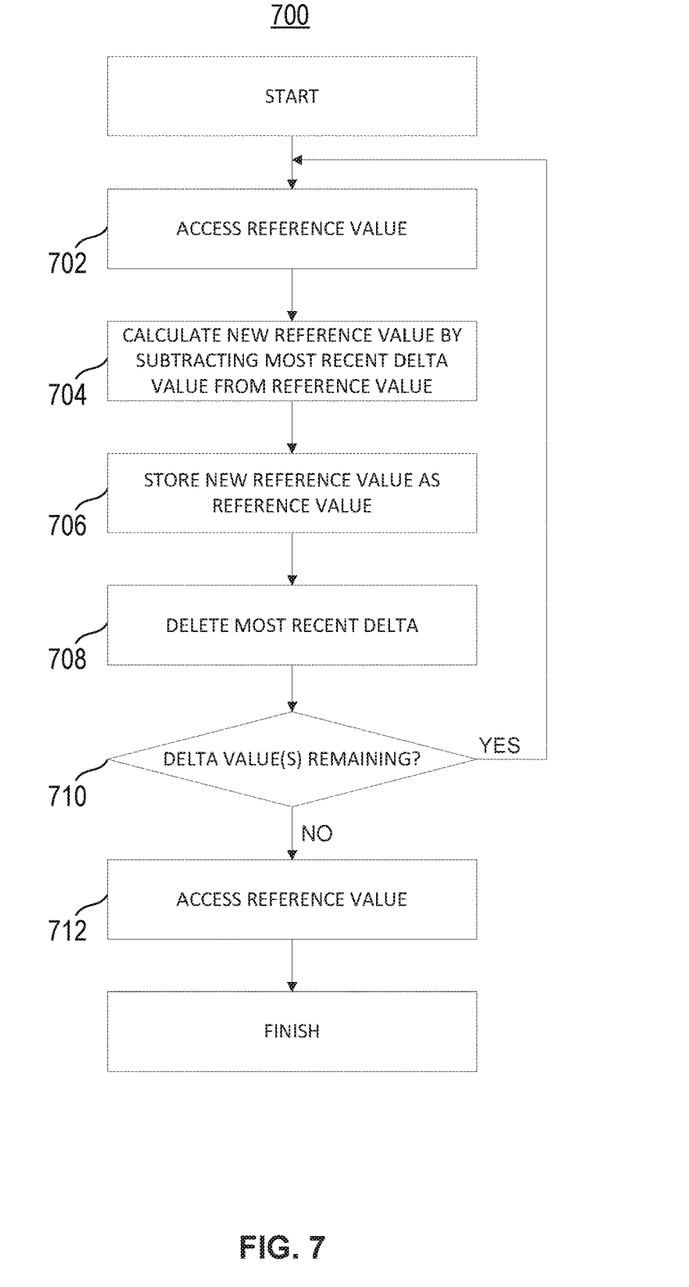
FIG. 7 illustrates an example flow for decompressing a data set in accordance with certain embodiments.

FIG. 7 illustrates an example flow 700 for decompressing a data set in accordance with certain embodiments. The operations may be performed by any suitable logic, such as core 114, accelerator 113, storage device 106, memory device 107, compression logic 800 (of FIG. 8), other logic of system 100, or other suitable logic. The operations may be performed by hardware and/or via software instructions executed by a processor. The operations may be performed in a per-memory manner or a per-region manner (if multiple reference values are used).

At 702, a reference value is accessed. The accessed value is one of the values of the decompressed set. At 704, a new reference value is calculated by subtracting the most recent delta value from the reference value. At 706, the new reference value is stored as the reference value.

For example, memory storing the reference value may be overwritten with the new reference value. At 708, the most recent delta is deleted. In various embodiments, this may comprise shifting any remaining delta values (excluding the most recent delta value) such that the memory storing the most recent delta is overwritten.

At 710, it is determined whether one or more delta values remain in the memory. If one or more delta values remain, the flow returns to 702 and an additional decompressed value is recovered by accessing the reference value and the other operations of the flow are repeated. If it is determined that no more deltas remain, the last decompressed value is recovered by accessing the reference value at 712 and the flow ends.

The flow described in FIG. 7 is merely representative of operations that may occur in particular embodiments. In other embodiments, additional operations may be performed. Various embodiments of the present disclosure contemplate any suitable signaling mechanisms for accomplishing the functions described herein. Some of the operations illustrated in FIG. 7 may be repeated, combined, modified or omitted where appropriate. Additionally, operations may be performed in any suitable order without departing from the scope of particular embodiments.

Figure 8:
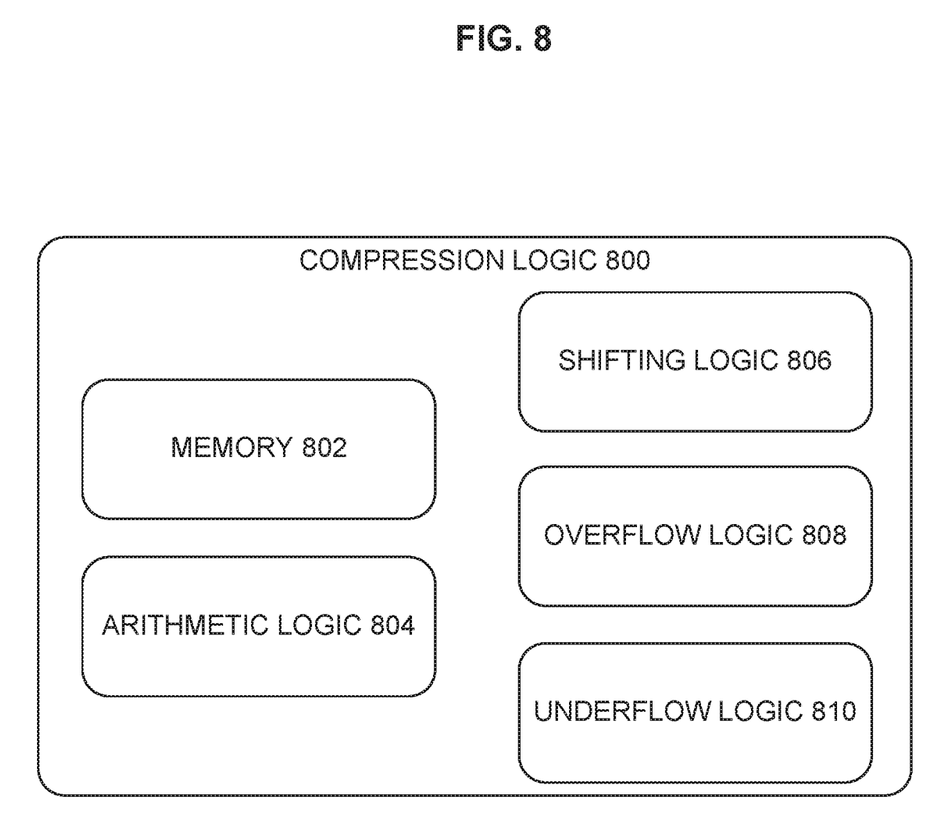
FIG. 8 illustrates example block diagram of compression logic in accordance with certain embodiments.

FIG. 8 illustrates an example block diagram of compression logic 800 in accordance with certain embodiments. In various embodiments, any portion of the depicted compression logic 800 may be located within any suitable component of system 100 (such as core 114, accelerator 113, storage device 106, memory device 107, other logic of system 100) or other computer system or device. In particular embodiments, a processor may be a group of logic (e.g., any of the logic depicted in compression logic 800 or other suitable logic) that is to receive a data set to be compressed and compress the data according to one or more of the methods described herein.

In the embodiment depicted, compression logic 800 comprises memory 802, arithmetic logic 804, shifting logic 806, overflow logic 808, and underflow logic 810. Memory 802 may have any of the characteristics described above with respect to the memory of storage device 106, memory device 107, memory 200, memory 300, and/or memory 400. Memory 802 may store deltas, one or more reference values, and any other data used to implement the various encoding schemes described above (e.g., information associated with an indicator of which region should be written to next, information allowing the determination of the length of one or more of the deltas, information allowing the determination of an overflow condition or underflow condition, or any other suitable information, or other suitable information). In various embodiments, memory 802 may comprise a block of memory that stores one or more references values and associated deltas. In other embodiments, memory 802 may comprise a block of memory to store one or more reference values and a separate block of memory to store deltas. In other embodiments, the memory 802 may be configured in other suitable manners. In a particular embodiment, a portion of memory 802 that stores deltas is configured as a shift register capable of shifting bits in either direction.

In various embodiments, arithmetic logic 804 comprises logic (e.g., adders or other logical units) for performing various operations described herein, such as determining a delta between successive values of a data set, determining a delta between a value of a data set and a reference value, subtracting a delta from a reference value to determine a new reference value, subtracting multiple deltas from a reference value to determine a new reference value when multiple values are recovered together from the compressed set, or other suitable operations. Shifting logic 806 may comprise logic to control the shifting of data (e.g., deltas) stored within memory 802 (e.g., when a delta is added to memory 802 or when a delta is deleted from memory 802). In some embodiments, shifting logic 806 may also comprise logic to control the swapping of the contents of memory regions (e.g., when multiple reference values are used) (which may be accomplished by shifting data, by directly copying the data to its new location, or by other suitable manner). Overflow logic 808 may comprise logic to detect actual or expected overflow conditions and underflow logic 810 may comprise logic to detect actual or expected underflow conditions.

Figure 9:
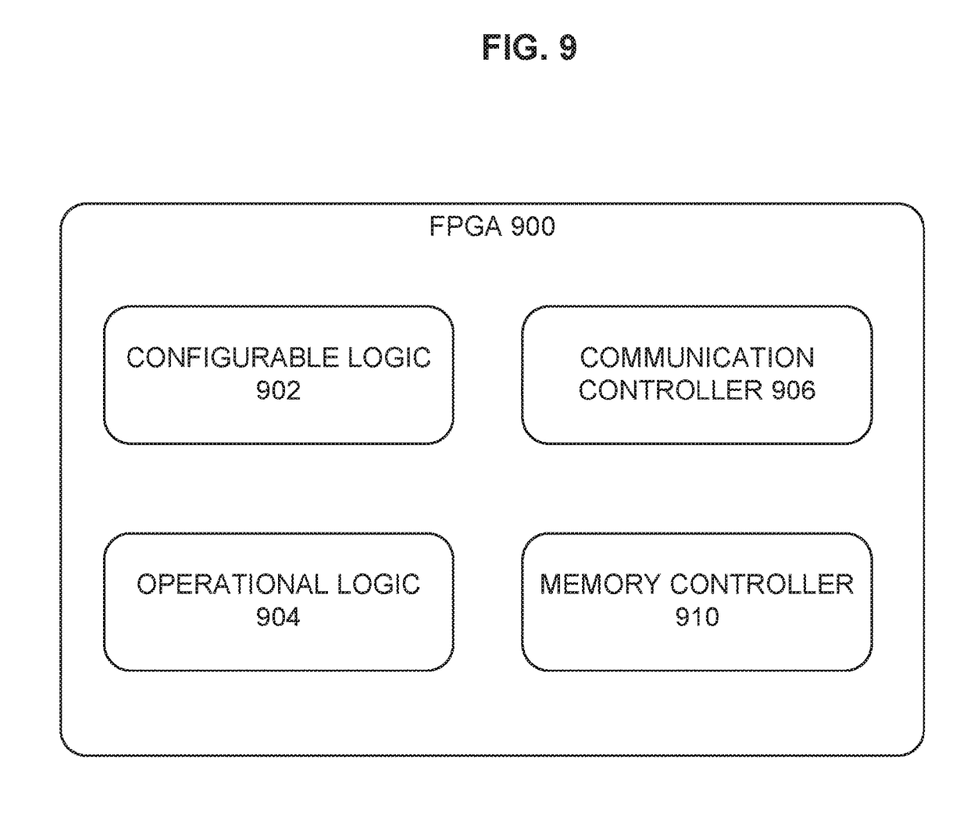
FIG. 9 illustrates an example block diagram of a field programmable gate array (FGPA) in accordance with certain embodiments.

FIG. 9 illustrates an example block diagram of a field programmable gate array (FPGA) 900 in accordance with certain embodiments. In various embodiments, any portion of the FPGA 900 may be located within any suitable component of system 100 (such as core 114, accelerator 113, storage device 106, memory device 107, other logic of system 100) or other computer system or device. In various embodiments, an FPGA may be a processor that implements methods described herein.

A computer system 100 may comprise any number of FPGAs 900. An FPGA may be a semiconductor device that includes configurable logic. An FPGA may be programmed via a data structure (e.g., a bitstream) having any suitable format that defines how the logic of the FPGA is to be configured. An FPGA may be reprogrammed any number of times after the FPGA is manufactured.

In the depicted embodiment, FPGA 900 includes configurable logic 902, operational logic 904, communication controller 906, and memory controller 910. Configurable logic 902 may be programmed to implement one or more kernels. A kernel may comprise configured logic of the FPGA that may receive a set of one or more inputs, process the set of inputs using the configured logic, and provide a set of one or more outputs. The kernel may perform any suitable type of processing. In various embodiments, a kernel may comprise a video processor, an image processor, a waveform generator, a pattern recognition module, a packet processor, an encryptor, a decryptor, an encoder, a decoder, a processor operable to perform any number of operations each specified by a distinct instruction sequence, or other suitable processing function. Some FPGAs 900 may be limited to executing a single kernel at a time while other FPGAs may be capable of executing multiple kernels simultaneously. The configurable logic 902 may include any suitable logic, such as any suitable type of logic gates (e.g., AND gates, XOR gates) or combinations of logic gates (e.g., flip flops, look up tables, adders, multipliers, multiplexers, demultiplexers). In some embodiments, the logic is configured (at least in part) through programmable interconnects between logic components of the FPGA.

Operational logic 904 may access a data structure defining a kernel and configure the configurable logic 902 based on the data structure and perform other operations of the FPGA. In some embodiments, operational logic 904 may write control bits to memory (e.g., nonvolatile flash memory or SRAM based memory) of the FPGA 900 based on the data structure, wherein the control bits operate to configure the logic (e.g., by activating or deactivating particular interconnects between portions of the configurable logic). The operational logic 904 may include any suitable logic (which may be implemented in configurable logic or fixed logic), such as one or more memory devices including any suitable type of memory (e.g., random access memory (RAM)), one or more transceivers, clocking circuitry, one or more processors located on the FPGA, one or more controllers, or other suitable logic.

Communication controller 906 may enable FPGA 900 to communicate with other components (e.g., cores 114) of the computer system 100 (e.g., to receive commands to configure or execute kernels). Memory controller 910 may enable the FPGA to read data (e.g., operands or results) from or write data to memory of the computer system 100. In various embodiments, memory controller 910 may comprise a direct memory access (DMA) controller.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, processor 108, core 114, accelerator 113, I/O controller 110, CPU memory controller 112, external I/O controller 104, storage device 106, memory device 107, memory blocks 200, 300, and 400, compression logic 800 (and the various logical components therein), and FPGA 900 (and the various logical components therein), or other component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, an apparatus for encoding a data set using a variable reference value and a plurality of deltas comprises a processor to receive a plurality of values of a data set, the data set comprising a first value, a second value; and a third value; calculate and store a first delta corresponding to the first value, wherein the first delta is equal to the difference between the first value and the second value; and calculate and store a second delta corresponding to the second value, wherein the second delta is equal to the difference between the second value and the third value.

In an embodiment, the processor is further to store the third value as a first reference value. In an embodiment, the first reference value is stored using a first number of bits and the first delta is stored using a second number of bits, the first number being greater than the second number. In an embodiment, the first delta is stored with an indication of the number of bits used to store the first delta and the second delta is stored with an indication of the number of bits used to store the second delta. In an embodiment, the processor is further to shift a plurality of bits used to store the first delta based on a number of bits used to store the second delta prior to storing the second delta. In an embodiment, the processor is further to update the first reference value to the difference between the first reference value and the second delta; and delete the second delta. In an embodiment, the processor is further to update the first reference value to the difference between the first reference value and the first delta; and delete the first delta. In an embodiment, the data set further comprises a fourth value and a fifth value and the processor is further to calculate and store a third delta corresponding to the fourth value, wherein the third delta is the difference between the fourth value and the fifth value; and store the fifth value as a second reference value in a memory location that is different from a memory location that stores the first reference value. In an embodiment, In an embodiment, the processor is further to access the first reference value and the second reference value in parallel to determine at least two of the values of the data set during decompression of the data set. In an embodiment, the apparatus further comprises a battery communicatively coupled to the processor; or a display communicatively coupled to the processor.

In at least one embodiment a method for encoding a data set using a variable reference value and a plurality of deltas comprises receiving a plurality of values of a data set, the data set comprising a first value, a second value, and a third value; calculating and storing a first delta corresponding to the first value, wherein the first delta is equal to the difference between the first value and the second value; and calculating and storing a second delta corresponding to the second value, wherein the second delta is equal to the difference between the second value and the third value.

In an embodiment, the method further comprises storing the third value as a first reference value. In an embodiment, the first reference value is stored using a first number of bits and the first delta is stored using a second number of bits, the first number being greater than the second number. In an embodiment, the first delta is stored with an indication of the number of bits used to store the first delta and the second delta is stored with an indication of the number of bits used to store the second delta. In an embodiment, the method further comprises shifting a plurality of bits used to store the first delta based on a number of bits used to store the second delta prior to storing the second delta. In an embodiment, the method further comprises updating the first reference value to the difference between the first reference value and the second delta; and deleting the second delta. In an embodiment, the method further comprises updating the first reference value to the difference between the first reference value and the first delta; and deleting the first delta. In an embodiment, the data set further comprises a fourth value and a fifth value, and the method further comprises calculating and storing a third delta corresponding to the fourth value, wherein the third delta is the difference between the fourth value and the fifth value; and storing the fifth value as a second reference value in a memory location that is different from a memory location that stores the first reference value. In an embodiment, the method further comprises accessing the first reference value and the second reference value in parallel to determine at least two of the values of the data set during decompression of the data set. In an embodiment, the method further comprises one or more of providing power by a battery communicatively coupled to a processor that calculates the first delta and the second delta; or displaying information by a display communicatively coupled to the processor. In an embodiment, the second delta is stored using a third number of bits, the third number being different from the second number. In an embodiment, the method further comprises storing at least one additional reference value and a plurality of deltas, wherein a plurality of values of the data set may be reconstituted using the at least one additional reference value and the plurality of deltas.

In at least one embodiment, a non-transitory machine readable medium including information to represent structures, when manufactured, to be configured to receive a plurality of values of a data set, the data set comprising a first value, a second value; and a third value; calculate and store a first delta corresponding to the first value, wherein the first delta is equal to the difference between the first value and the second value; and calculate and store a second delta corresponding to the second value, wherein the second delta is equal to the difference between the second value and the third value.

In an embodiment, the structures when manufactured are further configured to store the third value as a first reference value. In an embodiment, the structures when manufactured are further configured to store the first delta with an indication of the number of bits used to store the first delta; and store the second delta with an indication of the number of bits used to store the second delta. In an embodiment, the structures when manufactured are further configured to shift a plurality of bits used to store the first delta based on a number of bits used to store the second delta prior to storing the second delta. In an embodiment, the structures when manufactured are further configured to calculate and storing a third delta corresponding to a fourth value of the data set, wherein the third delta is the difference between the fourth value and a fifth value of the data set; and store the fifth value as a second reference value in a memory location that is different from a memory location that stores the first reference value.

In at least one embodiment, a system comprises means for receiving a plurality of values of a data set, the data set comprising a first value, a second value; and a third value; means for calculating and means for storing a first delta corresponding to the first value, wherein the first delta is equal to the difference between the first value and the second value; and means for calculating and means for storing a second delta corresponding to the second value, wherein the second delta is equal to the difference between the second value and the third value.

In an embodiment, the system further comprises means for storing the third value as a first reference value. In an embodiment, the system further comprises means for storing the first delta with an indication of the number of bits used to store the first delta; and means for storing the second delta with an indication of the number of bits used to store the second delta. In an embodiment, the system further comprises means for shifting a plurality of bits used to store the first delta based on a number of bits used to store the second delta prior to storing the second delta. In an embodiment, the system further comprises means for calculating and means for storing a third delta corresponding to a fourth value of the data set, wherein the third delta is the difference between the fourth value and a fifth value of the data set; and means for storing the fifth value as a second reference value in a memory location that is different from a memory location that stores the first reference value.

In at least one embodiment, a non-transitory machine readable medium comprises instructions that when executed by a machine, cause the machine to receive a plurality of values of a data set, the data set comprising a first value, a second value; and a third value; calculate and store a first delta corresponding to the first value, wherein the first delta is equal to the difference between the first value and the second value; and calculate and store a second delta corresponding to the second value, wherein the second delta is equal to the difference between the second value and the third value.

In an embodiment, the instructions are further to cause the machine to store the third value as a first reference value. In an embodiment, the instructions are further In an embodiment, the instructions are further to cause the machine to store the first delta with an indication of the number of bits used to store the first delta; and store the second delta with an indication of the number of bits used to store the second delta. In an embodiment, the instructions are further to cause the machine to shift a plurality of bits used to store the first delta based on a number of bits used to store the second delta prior to storing the second delta. In an embodiment, the instructions are further to cause the machine to calculate and storing a third delta corresponding to a fourth value of the data set, wherein the third delta is the difference between the fourth value and a fifth value of the data set; and store the fifth value as a second reference value in a memory location that is different from a memory location that stores the first reference value.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a processor to:
      receive a plurality of values of a data set, the data set comprising a first value, a second value, and a third value;
      calculate and store, in a memory, a first delta corresponding to the first value, wherein the first delta is equal to the difference between the first value and the second value;
      calculate a second delta corresponding to the second value, wherein the second delta is equal to the difference between the second value and the third value;
      shift the stored first delta within the memory based on a number of bits to represent the second delta; and
      store at least a portion of the second delta within the memory at a memory location that stored at least a portion of the first delta prior to the shifting of the first delta within the memory.

2. The apparatus of claim 1, wherein the processor is further to store the third value in the memory as a first reference value.

3. The apparatus of claim 2, wherein the first reference value is stored using a first number of bits and the first delta is stored using a second number of bits, the first number being greater than the second number.

4. The apparatus of claim 1, wherein the first delta is stored in the memory with an indication of the number of bits used to store the first delta and the second delta is stored in the memory with an indication of the number of bits used to store the second delta.

5. The apparatus of claim 2, the processor to store the second delta contiguous to the first reference value in the memory.

6. The apparatus of claim 2, the processor further to:
   update the first reference value to the difference between the first reference value and the second delta; and
   delete the second delta.

7. The apparatus of claim 6, the processor further to:
   update the first reference value to the difference between the first reference value and the first delta; and
   delete the first delta.

8. The apparatus of claim 2, wherein the data set further comprises a fourth value and a fifth value and the processor is further to:
   calculate and store, in the memory, a third delta corresponding to the fourth value, wherein the third delta is the difference between the fourth value and the fifth value; and
   store, in the memory, the fifth value as a second reference value in a memory location of the memory that is different from a memory location of the first reference value in the memory.

9. The apparatus of claim 8, wherein the processor is further to access the first reference value and the second reference value from the memory in parallel to determine at least two of the values of the data set during decompression of the data set.

10. The apparatus of claim 1, further comprising one or more of:
    a battery communicatively coupled to the processor; or
    a display communicatively coupled to the processor.

11. A method comprising:
- receiving a plurality of values of a data set, the data set comprising a first value, a second value, and a third value;
- calculating and storing in a memory, by a processor comprising logic, a first delta corresponding to the first value, wherein the first delta is equal to the difference between the first value and the second value;
- calculating, by the processor, a second delta corresponding to the second value, wherein the second delta is equal to the difference between the second value and the third value;
- shifting the stored first delta within the memory based on a number of bits to represent the second delta; and
- storing at least a portion of the second delta within the memory at a memory location that stored at least a portion of the first delta prior to the shifting of the first delta within the memory.

12. The method of claim 11, further comprising storing the third value in the memory as a first reference value.

13. The method of claim 11, further comprising storing the first delta with an indication of the number of bits used to store the first delta and storing the second delta with an indication of the number of bits used to store the second delta.

14. The method of claim 12, further comprising storing the second delta contiguous to the first reference value in the memory.

15. The method of claim 11, further comprising:
- calculating and storing, in the memory, a third delta corresponding to a fourth value of the data set, wherein the third delta is the difference between the fourth value and a fifth value of the data set; and
- storing, in the memory, the fifth value as a second reference value in a memory location of the memory that is different from a memory location of the first reference value in the memory.

16. A non-transitory machine readable medium including information to represent structures, when manufactured, to be configured to:
- receive a plurality of values of a data set, the data set comprising a first value, a second value, and a third value;
- calculate and store, in a memory, a first delta corresponding to the first value, wherein the first delta is equal to the difference between the first value and the second value;
- calculate a second delta corresponding to the second value, wherein the second delta is equal to the difference between the second value and the third value;
- shift the stored first delta within the memory based on a number of bits to represent the second delta; and
- store at least a portion of the second delta within the memory at a memory location that stored at least a portion of the first delta prior to the shifting of the first delta within the memory.

17. The medium of claim 16, the structures when manufactured to be further configured to store the third value in the memory as a first reference value.

18. The medium of claim 16, the structures when manufactured to be further configured to:
- store the first delta with an indication of the number of bits used to store the first delta; and
- store the second delta with an indication of the number of bits used to store the second delta.

19. The medium of claim 17, the structures when manufactured to be further configured to store the second delta contiguous to the first reference value in the memory.

20. The medium of claim 16, the structures when manufactured to be further configured to:
- calculate and store, in the memory, a third delta corresponding to a fourth value of the data set, wherein the third delta is the difference between the fourth value and a fifth value of the data set; and
- store, in the memory, the fifth value as a second reference value in a memory location of the memory that is different from a memory location of the first reference value in the memory.

* * * * *